(12) United States Patent
Kadoshima et al.

(10) Patent No.: US 8,536,017 B2
(45) Date of Patent: Sep. 17, 2013

(54) METHOD OF MANUFACTURING SEMICONDUCTOR DEVICE

(75) Inventors: Masaru Kadoshima, Kanagawa (JP);
Hiroshi Umeda, Kanagawa (JP);
Tatsunori Kaneoka, Kanagawa (JP);
Katsuyuki Horita, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/363,312

(22) Filed: Jan. 31, 2012

(65) Prior Publication Data

US 2012/0208346 A1    Aug. 16, 2012

(30) Foreign Application Priority Data

Feb. 10, 2011   (JP) ................. 2011-026650

(51) Int. Cl.
*H01L 21/76* (2006.01)
(52) U.S. Cl.
USPC ........... 438/425; 438/424; 438/426; 438/427; 438/762; 438/763; 257/510; 257/797; 257/E21.546
(58) Field of Classification Search
USPC ............................................. 438/425
See application file for complete search history.

(56) References Cited

U.S. PATENT DOCUMENTS

| 7,674,685 B2 * | 3/2010 | Choi et al. ............. 438/427 |
| 7,682,927 B2 * | 3/2010 | Hoshi et al. ............. 438/424 |
| 7,919,390 B2 * | 4/2011 | Eun ..................... 438/435 |
| 8,202,784 B2 * | 6/2012 | Kim ..................... 438/427 |
| 2003/0022522 A1 * | 1/2003 | Nishiyama et al. ......... 438/762 |
| 2004/0072429 A1 * | 4/2004 | Hieda et al. ............. 438/689 |
| 2006/0175718 A1 | 8/2006 | Nitta |
| 2006/0178020 A1 * | 8/2006 | Hoshi et al. ............. 438/789 |
| 2006/0214258 A1 * | 9/2006 | Kiyotoshi .............. 257/510 |
| 2006/0216906 A1 * | 9/2006 | Smythe et al. .......... 438/438 |
| 2006/0246684 A1 * | 11/2006 | Hoshi et al. ............ 438/427 |
| 2006/0275999 A1 * | 12/2006 | Kitamura et al. .......... 438/401 |
| 2007/0166951 A1 * | 7/2007 | Arisumi et al. ........... 438/425 |

(Continued)

FOREIGN PATENT DOCUMENTS

JP     2006-196843 A      7/2006
JP     4331133 B2         9/2009

OTHER PUBLICATIONS

K. Ota, et al., "Stress Controlled Shallow Trench Isolation Technology to Suppress the Novel Anti-Isotropic Impurity Diffusion for 45nm-node High-Performance CMOSFETs", 2005 Symposium on VLSI Technology Digest of Technical Papers, pp. 138-139.

*Primary Examiner* — N Drew Richards
*Assistant Examiner* — Ankush Singal
(74) *Attorney, Agent, or Firm* — McGinn IP Law Group, PLLC

(57) ABSTRACT

A polysilazane film is formed over the main surface of a semiconductor substrate in such a manner that the upper surface level of the polysilazane film buried in a trench of 0.2 µm or less in width becomes higher than that of a pad insulating film and the upper surface level of the polysilazane film buried in a trench of 1.0 µm or more in width becomes lower than that of the pad insulating film. Then, heat treatment is conducted at 300° C. or more to convert the polysilazane film into a first buried film made of silicon oxide ($SiO_2$) and remove a void in the upper portion of the narrower trench.

5 Claims, 19 Drawing Sheets

(56) References Cited

U.S. PATENT DOCUMENTS

| | | | |
|---|---|---|---|
| 2007/0207590 A1* | 9/2007 | Kiyotoshi et al. | 438/424 |
| 2007/0212849 A1* | 9/2007 | Ludwig et al. | 438/424 |
| 2008/0014711 A1* | 1/2008 | Choi et al. | 438/424 |
| 2008/0176379 A1* | 7/2008 | Lee | 438/443 |
| 2008/0182381 A1* | 7/2008 | Kiyotoshi | 438/427 |
| 2008/0315283 A1* | 12/2008 | Miyazaki | 257/316 |
| 2009/0072323 A1* | 3/2009 | Kiyotoshi | 257/392 |
| 2009/0194810 A1* | 8/2009 | Kiyotoshi et al. | 257/326 |
| 2009/0215241 A1* | 8/2009 | Sato et al. | 438/424 |
| 2009/0215242 A1* | 8/2009 | Nitta | 438/427 |
| 2009/0243050 A1* | 10/2009 | Eun | 257/647 |
| 2010/0109062 A1* | 5/2010 | Kadoya | 257/296 |
| 2010/0283108 A1* | 11/2010 | Sawada et al. | 257/368 |
| 2011/0156221 A1* | 6/2011 | Rode et al. | 257/632 |

* cited by examiner

METHOD OF MANUFACTURING SEMICONDUCTOR DEVICE

CROSS-REFERENCE TO RELATED APPLICATIONS

The disclosure of Japanese Patent Application No. 2011-26650 filed on Feb. 10, 2011 including the specification, drawings and abstract is incorporated herein by reference in its entirety.

BACKGROUND

The present invention relates to a manufacturing technology of a semiconductor device, particularly, a technology effective when applied to the manufacture of a trench-type element isolation portion formed in the main surface of a semiconductor substrate.

With miniaturization of semiconductor elements to be used for LSI (large scale integration), miniaturization of element isolation portions for electrically isolating semiconductor elements from each other is progressing. In recent years, a shallow trench isolation process has been used widely for LSI, because it is expected to achieve higher integration and higher isolation capacity than a LOCOS (local oxidation of silicon) process.

In the shallow element isolation process, it is the common practice to form an element isolation trench in a predetermined region of a semiconductor substrate and then fill this trench with an oxide film deposited using CVD (chemical vapor deposition). As the trench width becomes narrower, however, the oxide film forms an overhang, which may lead to the formation of a void in the trench. Using an oxide film formed by the method of application which does not form an overhang and can fill the trench completely is therefore under investigation.

For example, Japanese Patent No. 4331133 (Patent Document 1) discloses a technology of applying a solution of perhydropolysilazane having a polystyrene-reduced weight average molecular weight within a range of from 3000 to 20000 to a base material having at least one trench, drying the solution to fill the trench with perhydropolysilzane, and then heating the perhydropolysilazane in a water vapor containing atmosphere to convert it into a siliceous material.

Japanese Patent Laid-Open No. 2006-196843 (Patent Document 2) discloses a technology of forming, in a silicon substrate, a first element isolation trench having a narrow opening width and a second element isolation trench having a wide opening width, filling the first element isolation trench with an HTO (high temperature oxide) film and a polysilazane film, and filling the second element isolation trench with an HTO film, a polysilazane film, and an HDP (high density plasma) film with the proviso that the polysilazane film is not abundantly filled in the second element isolation trench.

Further, K. Ota et al., Symp. VLSI Tech. Dig., pp. 138-139 (2005) (Non-patent Document 1) describes a technology of filling a trench with SOD (spin on dielectric) and HDP to relax the stress, which has been caused by HDP, with SOD.

[Patent Document 1] Japanese Patent No. 4331133
[Patent Document 2] Japanese Patent Laid-Open No. 2006-196843
[Non-patent Document 1] K. Ota, T. Yokoyama, H. Kawasaki, M. Morita, T. Kanai, S. Takahashi, T. Sanuki, E. Hasumi, T. Komoguchi, Y. Sogo, Y. Takasu, K. Eda, A. Oishi, K. Kasai, K. Ohno, M. Iwai, M. Saito, F. Matsuoka, N. Nagashima, T. Noguchi, and Y. Okamoto, "Stress Controlled Shallow Trench Isolation Technology to Suppress the Novel Anti-Isotropic Impurity Diffusion for 45 nm-node High-Performance CMOSFETs", 2005 Symposium on VLSI Technology Digest of Technical Papers, pp. 138-139

SUMMARY

In the formation of an oxide film by using the method of application, poly(perhydrosilazane) (commonly called "polysilazane") has been used mainly as the material thereof. Polysilazane is a polymeric material having a molecular structure of —$(SiH_2-NH)_n$— and it has a property of being converted into $SiO_2$ by the oxidation reaction with water vapor or the like. An oxide film for element isolation can be formed by utilizing this property. A formation method of the oxide film for element isolation by using the method of application, while using polysilazane as a material will hereinafter be described briefly.

First, a substrate having a plurality of element isolation trenches formed therein is prepared. A solution (polysilazane solution) obtained by dissolving polysilazane in an organic solvent such as dibutyl ether is applied onto the main surface of the substrate by using the method of application (spin coating). Then, the resulting substrate is subjected to a baking treatment of about 150° C. in the atmosphere to evaporate the organic solvent. A heat treatment is then performed at 300° C. or more in a water vapor atmosphere or the like to convert the polysilazane into $SiO_2$, thereby forming a buried oxide film.

Next, an unnecessary portion of the buried oxide film is removed using CMP (chemical mechanical polishing). With a solution containing hydrogen fluoride (HF) or the like, etch-back is performed to adjust the thickness of the buried oxide film in the trench. Thus, an element isolation portion is formed.

The method of forming the element isolation oxide film by using the method of application while using polysilazane as a material, however, has various technical problems described below.

As shown in FIG. 21, a buried oxide film 101 is formed by using the method of application so as to completely fill each of a trench 102 having a narrow isolation width (which will hereinafter be called "narrow isolation trench") and a trench 103 having a wide isolation width (which will hereinafter be called "wide isolation trench"). The narrow isolation trench 102 has a trench width of 0.2 μm or less (typical trench width: 0.2 μm) and the wide isolation trench 103 has a trench width of 1.0 μm or more (typical trench width: 1.0 μm). Described specifically, the buried oxide film 101 is formed in such a manner that the upper surface level of the buried oxide film 101 is higher than the upper surface level of a pad isolation film 104 formed on the main surface of a substrate 100. The reason is that when the buried oxide film 101 is subjected to CMP while not completely filling each of the narrow isolation trench 102 and the wide isolation trench 103 with the buried oxide film 101, a step difference is formed in the element isolation portion and at the same time, a pattern collapse of the element to be formed in a step later is induced.

The upper surface level of the buried oxide film 101 buried in the isolation trench 103 is likely to be lower than the upper surface level of the buried oxide film 101 buried in the narrow isolation trench 102. The buried oxide film 101 is therefore formed so that the upper surface level of the buried oxide film 101 buried in the wide isolation trench 103 becomes higher than the upper surface level of the pad insulating film 104.

According to the investigation by the present inventors, it has been elucidated that a void 105 is formed partially inside the narrow isolation trench 102 having a width of 0.2 μm or less. This void 105 is hardly formed in a trench having a width more than 0.2 μm and was not found, for example, from the wide isolation trench 103. The void 105 is presumed to be formed due to foam insertion (because a polysilazane solution is applied without removing a foam from the surface and the trace of the foam remains uncoated) during application of the polysilazane solution by the method of application; elution of nitrogen dissolved in the polysilazane solution (nitrogen used for pressure delivery of the polysilazane solution), or degassing during heat treatment at 300° C. or more.

The buried oxide film 101 is subjected to CMP under this state so that when the void 105 extends from the vicinity of the upper portion of the pad insulating film to the narrow isolation trench 102, a step difference is formed in the element isolation portion and at the same time, pattern collapse of an element to be formed in a step later is induced.

Further investigation by the present inventors has revealed that independently of the presence of the void 105, an etching rate of the buried oxide film 101 buried in the narrow isolation trench 102 with respect to a solution containing hydrogen fluoride or the like is higher than an etching rate of the buried oxide film 101 buried in the wide isolation trench 103 with respect to the solution containing a fluorine hydride or the like. A difference in this etching rate is presumed to be caused by a difference in the density of the buried oxide film 101. When the buried oxide film 101 is subjected to CMP while having the void 104 in the narrow isolation trench 102 and it is etched back with a solution containing hydrogen fluoride or the like, the void 105 increases further. The problem of a step difference of the element isolation portion has therefore become serious at the narrow isolation trench 102.

An object of the invention is to provide, in a semiconductor device having a trench type element isolation portion obtained by filling a trench with an oxide film formed by the method of application, a technology capable of suppressing generation of voids in the trench, thereby reducing burying failures.

The above-mentioned and the other objects and novel features of the invention will be apparent from the description herein and accompanying drawings.

Of the inventions disclosed herein, one embodiment of a typical invention will next be described briefly.

In this embodiment, there is provided a method of manufacturing a semiconductor device having a trench type element isolation portion. After formation of a plurality of trenches having a predetermined width in the main surface of a semiconductor substrate, a polysilazane film is formed on the main surface of the semiconductor substrate as a first insulating film to be buried in the trenches. This polysilazane film is formed in such a manner that the upper surface level of the polysilazane film to be filled in a narrow isolation trench having a trench width of 0.2 μm or less becomes higher than the upper surface level of a pad insulating film and at the same time the upper surface level of the polysilazane film to be filled in a wide isolation trench having a trench width of 1.0 μm or more becomes lower than the upper surface level of the pad insulating film. Then, heat treatment is performed at 300° C. or more to convert the polysilazane film into a first buried oxide film composed of silicon oxide ($SiO_2$) and at the same time, to remove voids which have been formed partially in the upper portion of the narrow isolation trench. Then a second buried oxide film is formed on the upper surface of the first buried oxide film.

Of the inventions disclosed herein, an advantage available from one embodiment of the typical invention will next be described briefly.

In a semiconductor device having a trench type element isolation portion obtained by filling a trench with an oxide film formed by the method of application, it is possible to suppress generation of voids in the trench and thereby reduce a burying failure.

DETAILED DESCRIPTION

Figure 1:
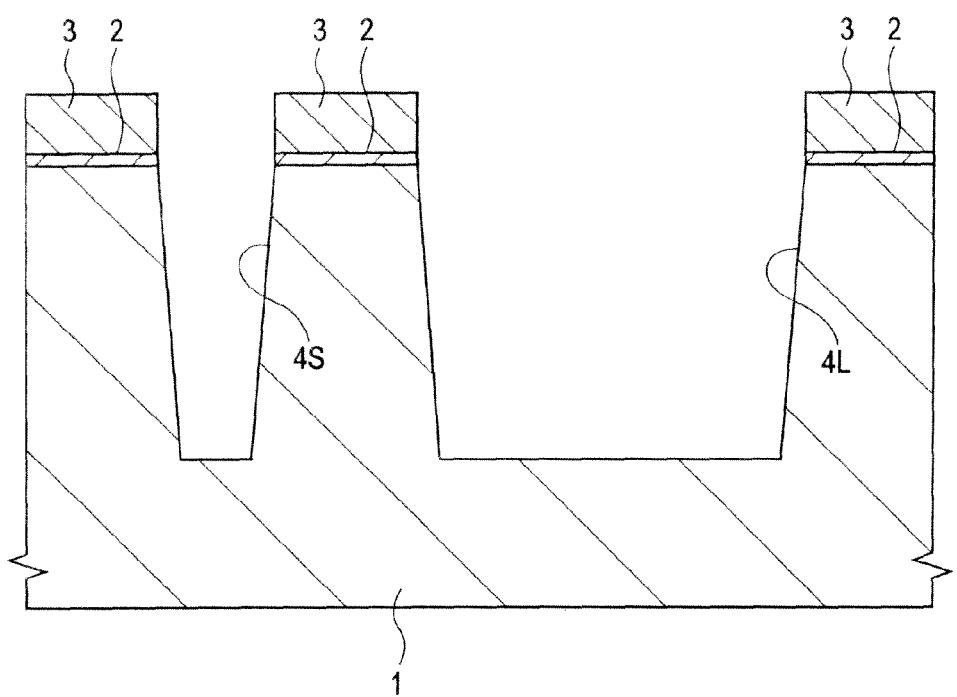
FIG. 1 is a fragmentary cross-sectional view of an element isolation portion during a manufacturing step for describing a manufacturing method of an element isolation portion according to Embodiment 1 of the invention.

In the below-described embodiments, a description will be made after divided into a plurality of sections or embodiments if necessary for convenience sake. They are not independent from each other, but in a relation such that one is a modification example, details, a complementary description, or the like of a part or whole of the other one unless otherwise specifically indicated.

And, in the below-described embodiments, when a reference is made to the number of elements (including the number, value, amount, range, or the like), the number is not limited to a specific number but may be more than or less than the specific number, unless otherwise specifically indicated or principally apparent that the number is limited to the specific number. Further, in the below-described embodiments, it is needless to say that the constituent elements (including element steps or the like) are not always essential unless otherwise specifically indicated or principally apparent that they are essential. Similarly, in the below-described embodiments, when a reference is made to the shape, positional relationship, or the like of the constituent elements, that substantially approximate or similar to it is also embraced unless otherwise specifically indicated or principally apparent that it is not. This also applies to the above-described value and range.

In the drawings used in the below-described embodiments, some plan views may be hatched in order to facilitate viewing of them. In the below-described embodiments, the term "wafer" mainly means an Si (silicon) single crystal wafer, but the term "wafer" means not only it but also an SOI (silicon on insulator) wafer, an insulating film substrate for forming an integrated circuit thereover, or the like. The shape of the wafer is not limited to circular or substantially circular, but it may be square, rectangular or the like.

And, in all the drawings for describing the below-described embodiments, members of a like function will be identified by like reference numerals in principle and overlapping descriptions will be omitted. Hereafter, embodiments of the invention will be described in detail based on drawings.

Embodiment 1

Next, a manufacturing method of a semiconductor device using a trench type element isolation portion according to Embodiment 1 will be described in the order of steps, while referring to FIGS. 1 to 15. FIGS. 1 to 5 and FIGS. 7 to 10 are fragmentary cross-sectional views for describing manufacturing steps of the element isolation portion, FIG. 6 is a graph for describing a change in the number of defects (voids) generated in a buried oxide film formed by the method of application, and FIGS. 11 to 15 are fragmentary cross-sectional views for describing manufacturing steps of a semiconductor element (field effect transistor).

First, a semiconductor substrate (in this stage, a thin semiconductor sheet having a substantially circular plane which is called "semiconductor wafer") 1 having a p type impurity such as boron (B) introduced therein is prepared. Then, a silicon oxide film 2 and a pad insulating film 3 are formed successively on the main surface of the semiconductor substrate 1. The pad insulating film 3 is made of, for example, a silicon nitride film. The silicon oxide film 2 has a thickness of, for example, about 10 nm, while the pad insulating film 3 has a thickness of, for example, about from 0.05 to 0.2 μm.

Next, lithography and dry etching are used to successively process the pad insulating film 3, the silicon oxide film 2, the semiconductor substrate 1 to form a plurality of trenches each different in trench width in desired regions of the semiconductor substrate 1, respectively. In Embodiment 1, among these trenches, only two trenches different in trench width are exemplified. The trench indicated by the reference numeral 4S in the drawing is a trench (narrow isolation trench, first trench) having a trench width of, for example, 0.2 μm or less, while the trench indicated by the reference numeral 4L is a trench (wide isolation trench, second trench) having a trench width of, for example, 1.0 μm or more. The minimum trench width of the trench 4S is, for example, 50 nm. The trenches 4L and 4S have a depth of, for example, from about 0.15 to 0.4 μm from the main surface of the semiconductor substrate 1.

In this drawing, the side surface of each of the trenches 4L and 4S forms almost the same plane with the side surface of the pad insulating film 3, but processing may be made in such a manner that the side surface of each of the trenches 4L and 4S protrudes from the side surface of the pad insulating film 3, in other words, it is imparted with an offset.

Figure 2:
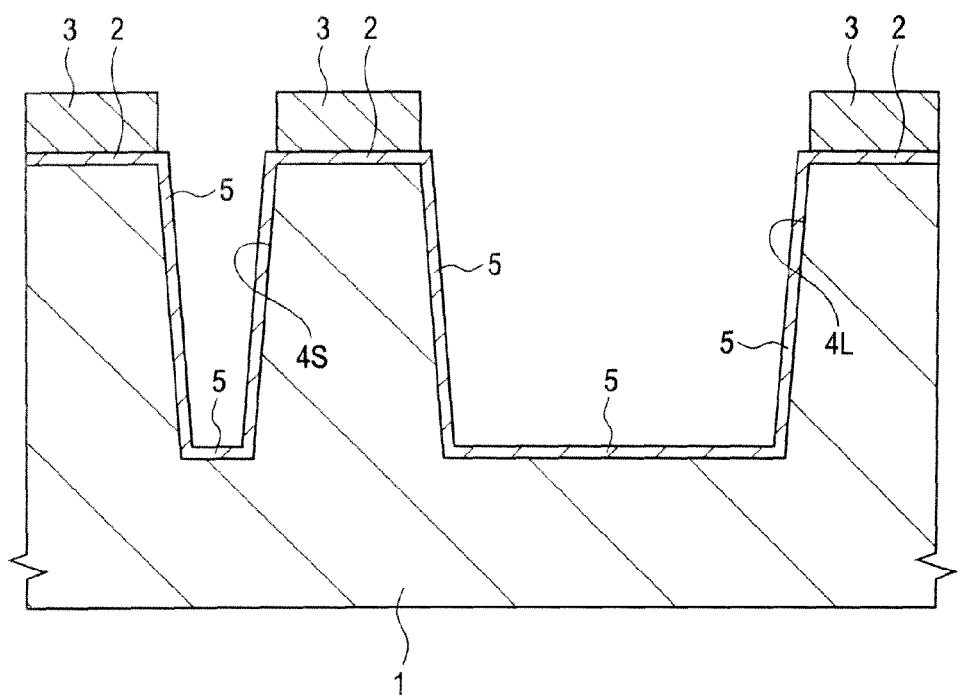
FIG. 2 is a fragmentary cross-sectional view of the same portion as that of FIG. 1 during a manufacturing step of the element isolation portion following the step shown in FIG. 1.

Next, as illustrated in FIG. 2, after washing the inside of the trenches 4L and 4S, the semiconductor substrate 1 on the inner walls (side surface and bottom surface) of the trenches 4L and 4S is oxidized by thermal oxidation to form an inner-wall oxide film 5. The inner-wall oxide film 5 has a thickness of, for example, about from 3 nm to 20 nm. When a process using an active oxidizing species such as radical oxidation process is employed as the thermal oxidation process, the side surface and the bottom surface of each of the trenches 4L and 4S which are different from each other in plane direction can be oxidized uniformly at a substantially same oxidation rate. When the trenches 4L and 4S with an offset are formed, the end portion of the main surface of the semiconductor substrate 1 in an active region is oxidized into a round shape so that it is possible to reduce the inconvenience of a field effect transistor, if it is formed on the main surface of the semiconductor substrate 1, due to the electric field concentration when the transistor is operated.

The formation of the inner-wall oxide film 5 may be followed by nitriding treatment. By this treatment, an oxide (for example, $SiO_2$) film becomes an oxynitride (for example, SiON) film, making it possible to prevent the semiconductor substrate 1 on the inner walls (side surface and the bottom surface) of the trenches 4L and 4S from being oxidized.

Figure 3:
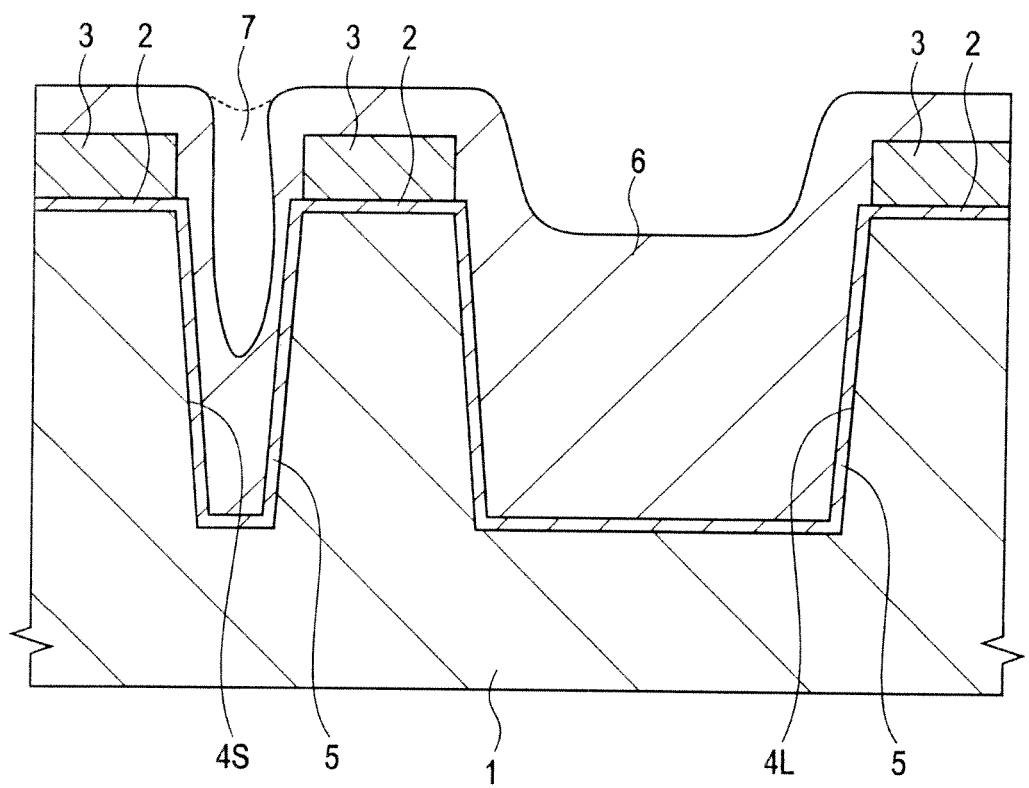
FIG. 3 is a fragmentary cross-sectional view of the same portion as that of FIG. 1 during a manufacturing step of the element isolation portion following the step shown in FIG. 2.

Next, as illustrated in FIG. 3, a polysilazane solution obtained by dissolving polysilazane ($—(SiH_2—NH)_n—$) in an organic solvent such as dibutyl ether is applied, as a first buried insulating film in the trenches 4L and 4S, onto the main surface of the semiconductor substrate 1 including the inside of the trenches 4L and 4S by the method of application (spin coating) to form a polysilazane film 6. The number of rotation in the method of application is, for example, 1000 rpm.

The polysilazane film 6 is formed in such a manner that the upper surface level of the polysilazane film 6 buried in the trench 4S becomes higher than the upper surface level of the pad insulating film 3 and at the same time, the upper surface level of the polysilazane film 6 buried in the trench 4L becomes lower than the upper surface level of the pad insulating film 3. More preferably, the polysilazane film 6 is formed in such a manner that the inside of the trench 4S (below the main surface of the semiconductor substrate 1) is completely filled with the polysilazane film 6 but the inside of the trench 4L (below the main surface of the semiconductor substrate 1) is not completely filled with the polysilazane film 6.

Alternatively, a polysilazane film 6 having a thickness enough to fill the inside of the trench 4S having a minimum trench width, for example, a thickness half of the minimum trench width is formed. In Embodiment 1, the minimum trench width is defined as 50 nm so that the thickness of the polysilazane film 6 is set at, for example, 25 nm. When the thickness of the polysilazane film 6 is smaller than half of the minimum trench width of the trench 4S, the trench 4S having the minimum trench width is not filled with the polysilazane film 6, which may be a cause for a burying failure.

When the polysilazane film 6 is formed on the main surface of the semiconductor substrate 1, a plurality of voids 7 is sometimes formed partially in the trench 4S which is a narrow isolation trench. The void 7 in the upper portion (near the main surface of the semiconductor substrate 1) of the trench 4S is not completely filled with the polysilazane film 6 and the upper portion of the void can be opened because as described above, the thickness of the polysilazane film 6 is adjusted (at this time, some of the voids 7 may rise up, reach the upper surface of the polysilazane film 6 and disappear).

FIG. 3 shows the cross-section of the trench 4S having the void 7 formed therein. In a trench 4S having no void 7 formed therein, the upper surface level of the polysilazane film 6 is higher than the upper surface level of the pad insulating film 3 as indicated by a dotted line.

Figure 4:
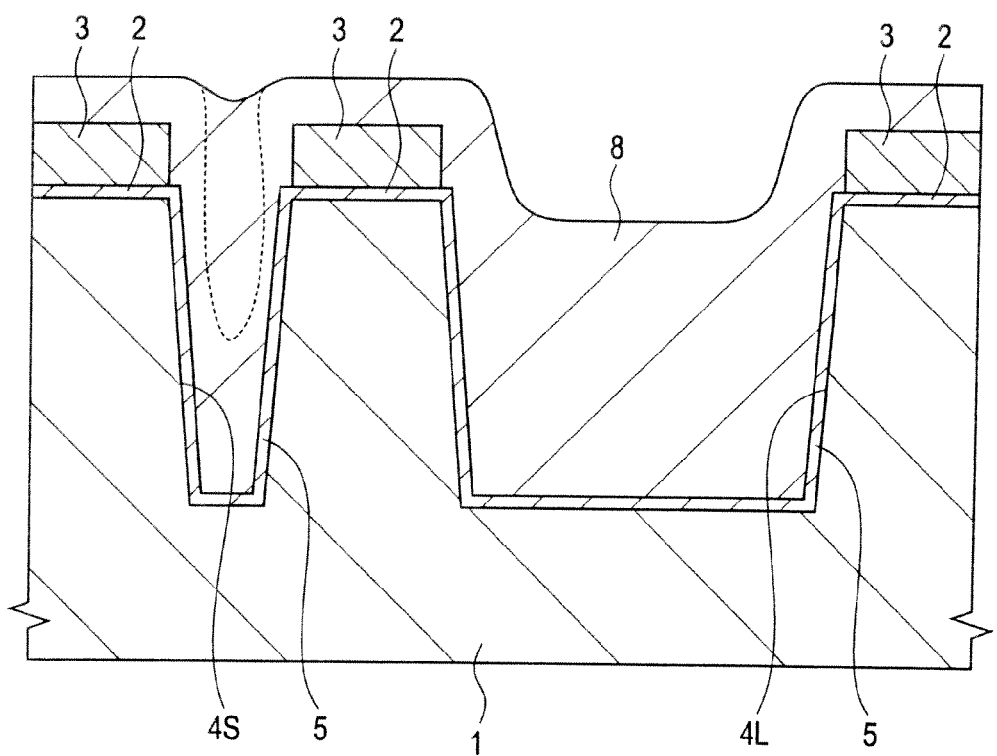
FIG. 4 is a fragmentary cross-sectional view of the same portion as that of FIG. 1 during a manufacturing step of the element isolation portion following the step shown in FIG. 3.

Next, the substrate is subjected to baking treatment at 150° C. in the atmosphere to evaporate the organic solvent. Then, the resulting substrate is heat treated at 300° C. or more in a water vapor atmosphere or the like, for example, at from 300° C. to 800° C. in a water vapor atmosphere or at about 1000° C. in an inert gas atmosphere. As a result of these treatments, the polysilazane film 6 is densified into a film having a stoichiometric composition ($SiO_2$), that is, a first buried oxide film 8 as shown in FIG. 4.

With this structural change from the polysilazane film 6 to the first buried oxide film 8, the void 7 floats up or the void 7 approaches the upper surface of the first buried oxide film 8 due to the surface tension so that another void 7 in the upper portion of the trench 4S gradually disappears. Even if the another void 7 does not disappear completely, the another void 7 remaining in the first buried oxide film 8 becomes smaller than that formed originally in the polysilazane film 6. Accordingly, the first buried oxide film 8 filled in the trench 4S has an upper surface which is recessed but has a level equal to or higher than the upper surface level of the pad insulating film 3.

Figure 5:
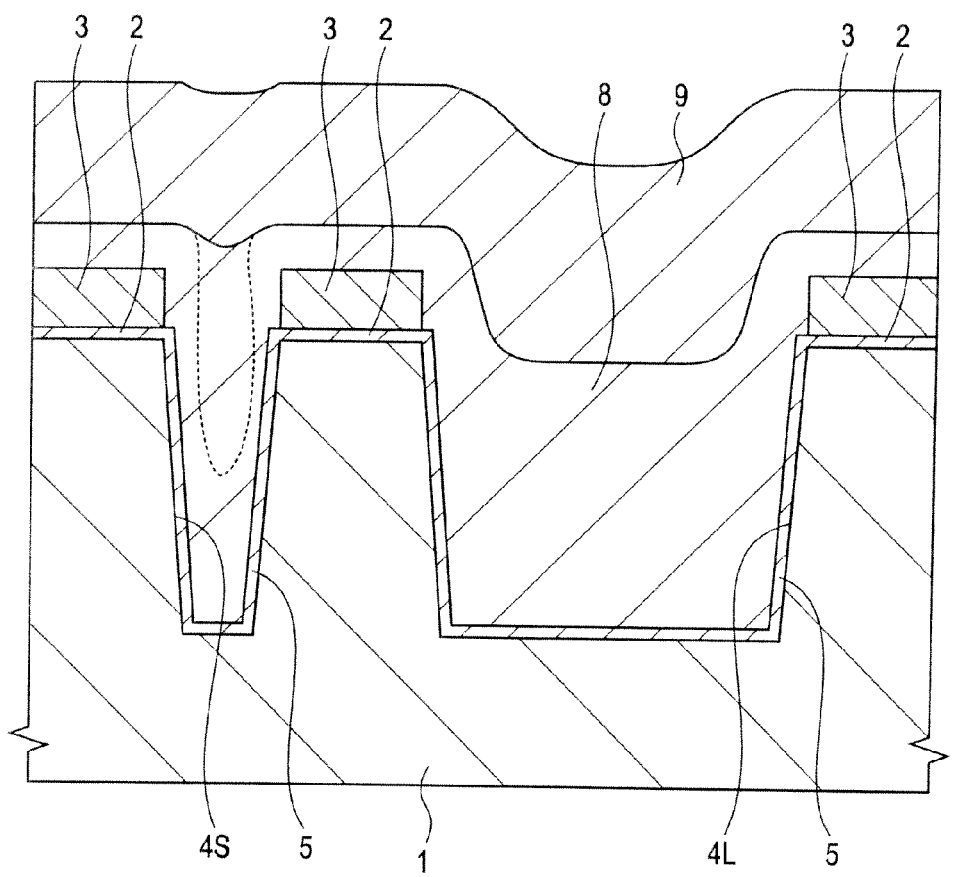
FIG. 5 is a fragmentary cross-sectional view of the same portion as that of FIG. 1 during a manufacturing step of the element isolation portion following the step shown in FIG. 4.
Figure 6:
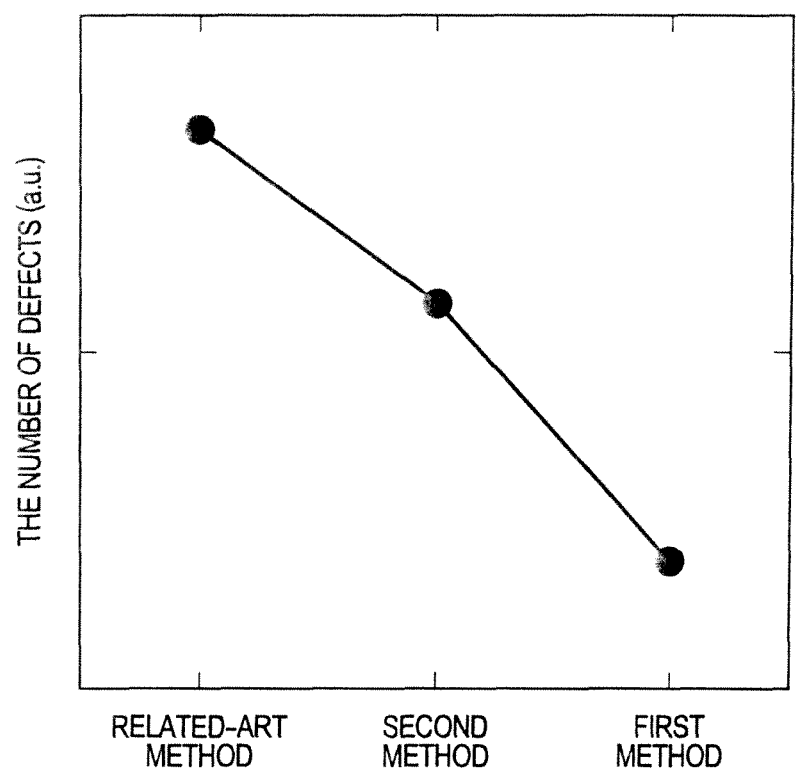
FIG. 6 is a graph for describing a change in the number of defects (voids) generated in a buried oxide film formed by the method of application according to Embodiment 1 of the invention.

Next, as illustrated in FIG. 5, a second buried oxide film 9 is formed on the upper surface of the first buried oxide film 8. This second buried oxide film 9 is formed using, for example, the method of application, SA-CVD (sub-atmospheric chemical vapor deposition), or HDP-CVD (high density plasma chemical vapor deposition). The second buried oxide film 9 to be buried in the trench 4L is formed in such a manner that the upper surface of the second buried oxide film 9 becomes higher than the upper surface level of the pad insulating film 3.

When the second buried oxide film 9 is formed using the method of application, it is formed in a similar manner to that employed for the formation of the first buried oxide film 8. Described specifically, a polysilazane solution obtained by dissolving polysilazane ($-(SiH_2-NH)_n-$) in an organic solvent such as dibutyl ether is applied onto the main surface of the semiconductor substrate 1 by using the method of application (spin coating) to form a polysilazane film. The number of rotations in the method of application is, for example, 1000 rpm. Then, baking treatment at about 150° C. in the atmosphere is performed to evaporate the organic solvent, followed by heat treatment at 300° C. or more in a water vapor atmosphere or the like or heat treatment at about 1000° C. in an inert gas atmosphere. As a result of these treatments, the polysilazane film is densified into a film having a stoichiometric composition ($SiO_2$), that is, the second buried oxide film 9.

When the second buried oxide film 9 is formed using the method of application, it is possible to carry out only the densification (heat treatment at 300° C. or more) after formation of the second buried oxide film 9 without carrying out the densification (heat treatment at 300° C. or more) after the formation of the first buried oxide film 8 and thereby simultaneously densify the polysilazane film 6 for the formation of the first buried oxide film 8 and the polysilazane film for the formation of the second buried oxide film 9.

In short, there are two methods. One is to form the first buried oxide film 8 through first application of a polysilazane solution, a first baking treatment, and first densification and then form the second buried oxide film 9 through second application of a polysilazane solution, a second baking treatment, and second densification. The other one is to form the first buried oxide film 8 and the second buried oxide film 9 through first application of a polysilazane solution, a first baking treatment, second application of a polysilazane solution, a second baking treatment, and first densification.

Figure 21:
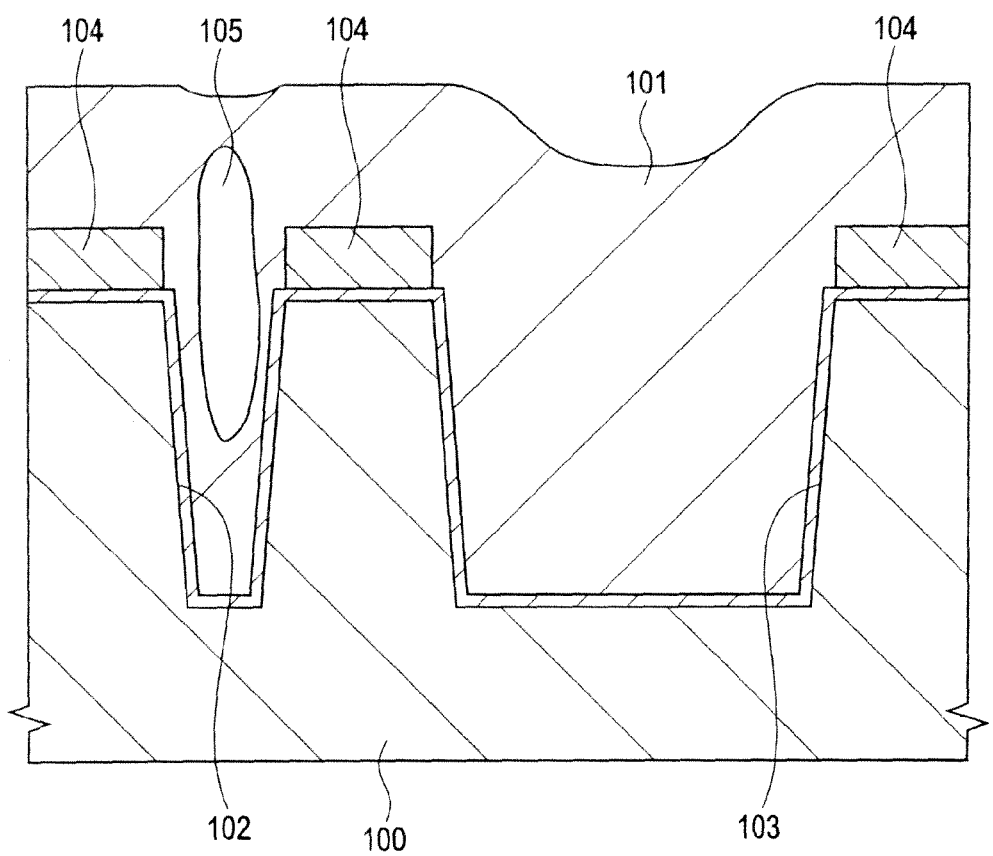
FIG. 21 is a fragmentary cross-sectional view of a trench type element isolation portion investigated by the present inventors prior to the present invention.

FIG. 6 is a graph for describing a change in the number of defects (voids) generated in the buried oxide film formed by the method of application. FIG. 6 shows the number of defects which have been generated in each of a film stack of the first buried oxide film and the second buried oxide film formed by the first method, a film stack of the first buried oxide film and the second buried oxide film formed by the second method, and a related art single-layer buried oxide film (for example, the buried oxide film described above referring to FIG. 21) thicker than the first buried oxide film.

As shown in FIG. 6, the number of defects in the film stack of the first buried oxide film and the second buried oxide film formed using the second method is smaller than that in the buried oxide film formed in the related art method. Further, the number of defects in the film stack of the first buried oxide film and the second buried oxide film formed using the first method is smaller than that in the film stack of the first buried oxide film and the second buried oxide film formed using the second method. This means that the second method can decrease the manufacturing time because the number of the densification steps is reduced to one, but the first method is more effective than the second method in eliminating the voids.

Figure 7:
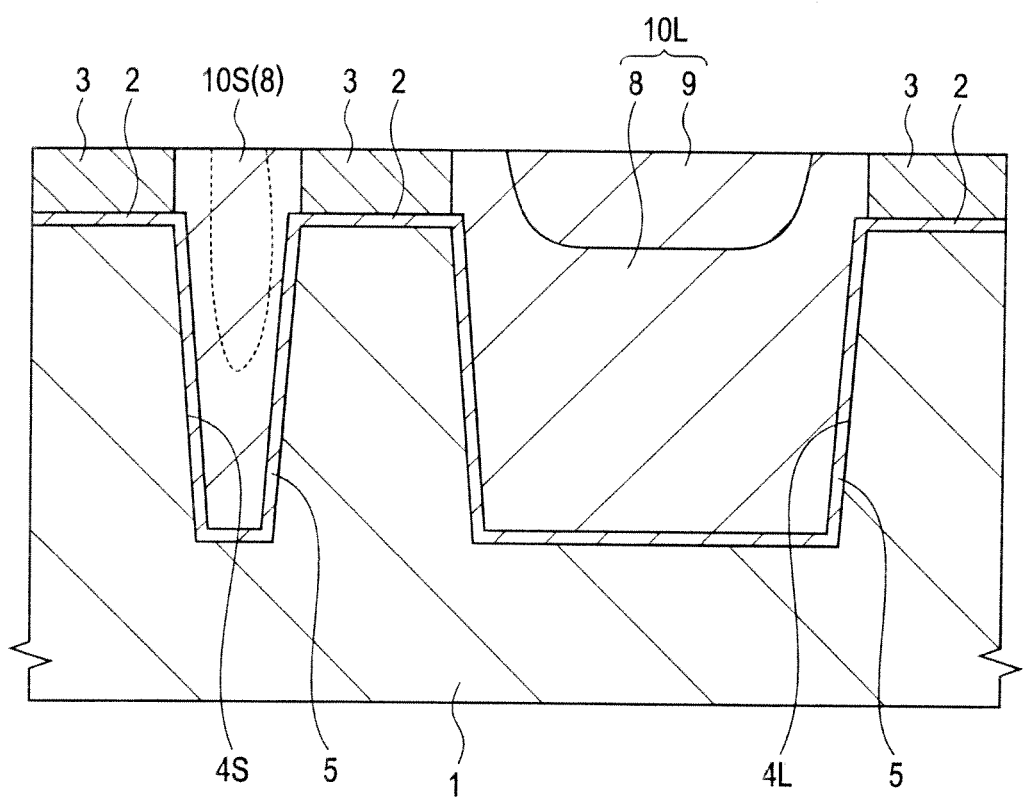
FIG. 7 is a fragmentary cross-sectional view of the same portion as that of FIG. 1 during a manufacturing step of the element isolation portion following the step shown in FIG. 5.

Next, as illustrated in FIG. 7, the surface of the second buried oxide film 9 and further the surface of the first buried oxide film 8 are polished using CMP with the pad insulating film 3 as a stopper film. As a result, an element isolation film 10L made of the first buried oxide film 8 and the second buried oxide film 9 is formed in the trench 4L, while an element isolation film 10S made of the first buried oxide film 8 is formed in the trench 4S.

As described above, the void 7 present partially in the upper portion (near the main surface of the semiconductor substrate 1) of the trench 4S disappears by the above heat treatment conducted at 300° C. or more, which alleviates the burying failure in the element isolation film 10S (first buried film 8) formed in the trench 4S due to the void. Even if the void 7 present partially in the upper portion (near the main surface of the semiconductor substrate 1) of the trench 4S does not disappear completely by the above heat treatment at 300° C. or more, the upper surface level of the first buried oxide film 8 filled in the trench 4S becomes higher than the upper surface level of the pad insulating film 3 so that the remaining void 7 can be removed by CMP.

A trench having a trench width (0.2 μm or less) wider than the trench width of the trench 4S but smaller than the trench width (1.0 μm or more) of the trench 4L is filled with the first buried oxide film 8 and the second buried oxide film 9 to form an element isolation film.

Figure 8:
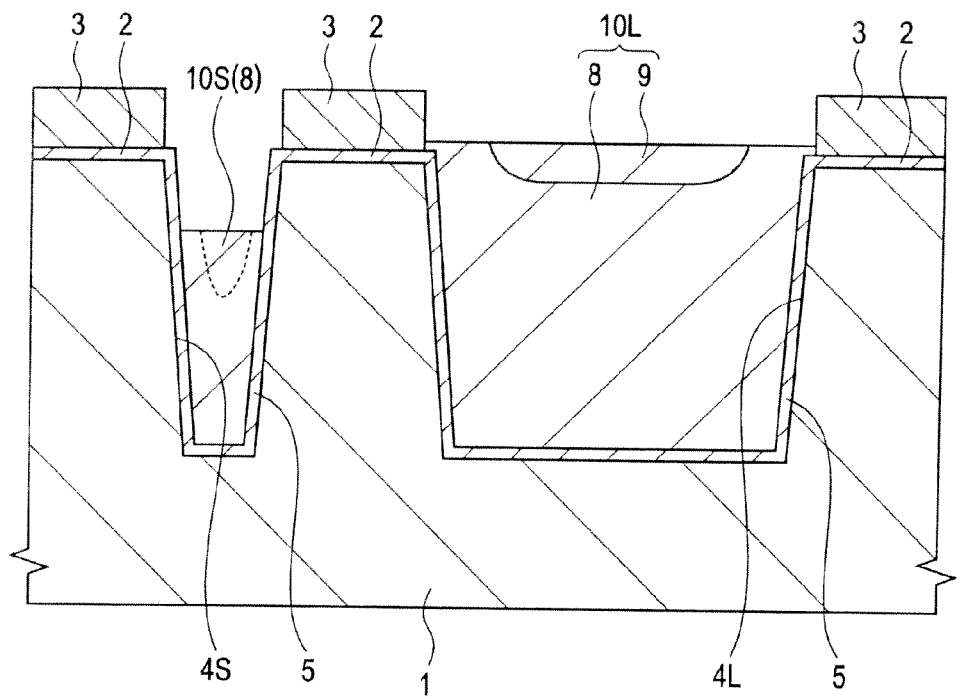
FIG. 8 is a fragmentary cross-sectional view of the same portion as that of FIG. 1 during a manufacturing step of the element isolation portion following the step shown in FIG. 7.

Next, as illustrated in FIG. 8, the element isolation films 10L and 10S are wet etched using a solution containing hydrogen fluoride or the like. The upper surface level of the element isolation film 10S becomes lower than the upper surface level of the element isolation film 10L because the etching rate of the element isolation film 10S is high and that of the element isolation film 10L is low. In Embodiment 1, the etching amounts of the element isolation films 10L and 10S are adjusted so that the upper surface level of the element isolation film 10L becomes higher than the main surface of the semiconductor substrate 1 and the upper surface level of the element isolation film 10S becomes lower than the main surface of the semiconductor substrate 1.

Figure 9:
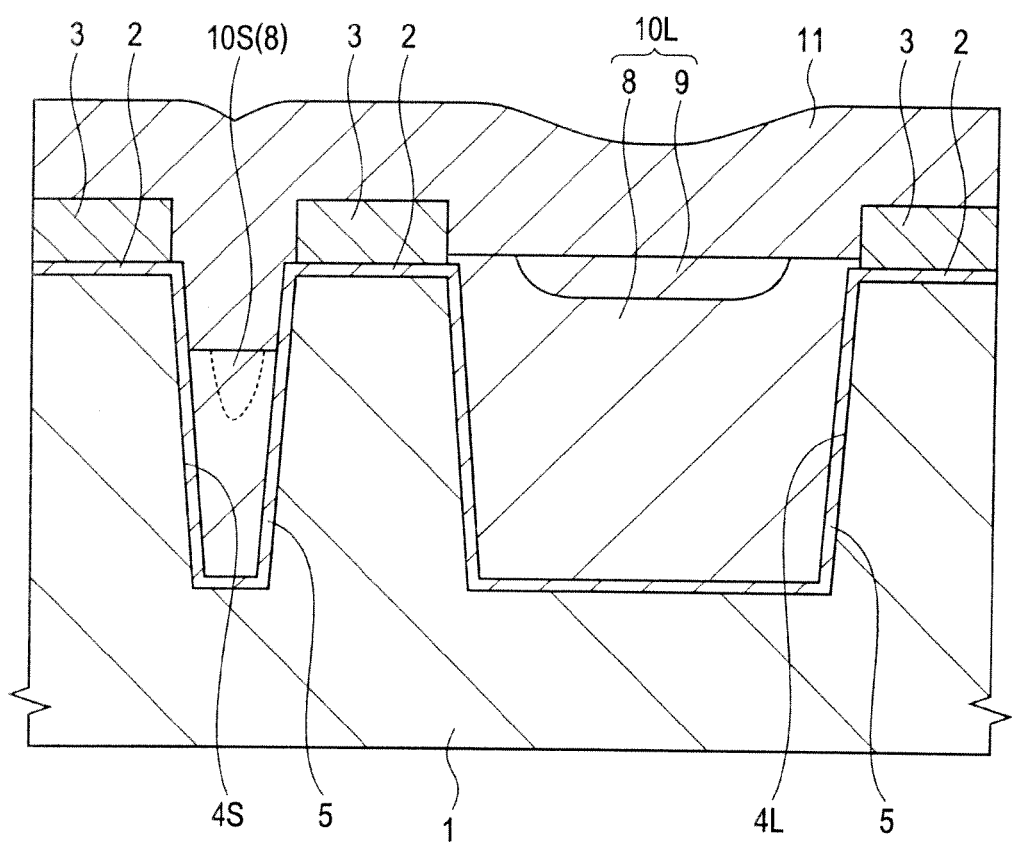
FIG. 9 is a fragmentary cross-sectional view of the same portion as that of FIG. 1 during a manufacturing step of the element isolation portion following the step shown in FIG. 8.

Next, as illustrated in FIG. 9, a protecting film 11 made of an oxide film is formed on the main surface of the semiconductor substrate 1 so as to cover therewith the element isolation films 10S and 10L. The trench 4S in which the element isolation film 10S has been etched can be filled with this protecting film 11.

Figure 10:
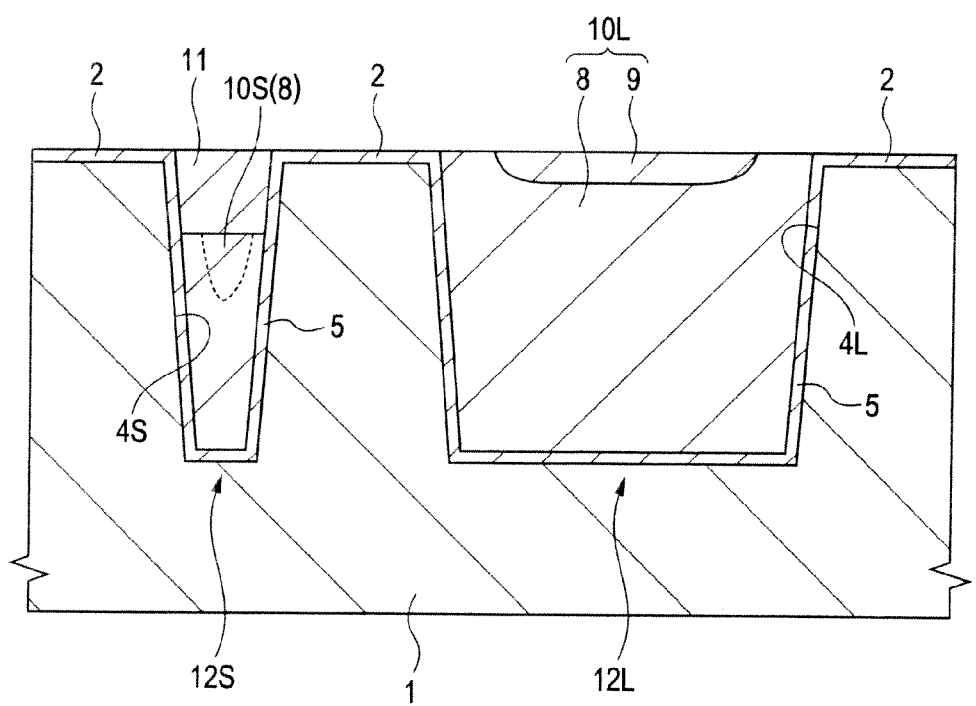
FIG. 10 is a fragmentary cross-sectional view of the same portion as that of FIG. 1 during a manufacturing step of the element isolation portion following the step shown in FIG. 9.

Next, as illustrated in FIG. 10, the surface of the protecting film 11 is removed using CMP, by which the element isolation film 10L is filled in the trench 4L and the element isolation film 10S and the protecting film 11 are filled in the trench 4S. Following the above treatment, the pad insulating film 3 is removed using hot phosphoric acid. By the above manufacturing steps, the element isolation portions 12L and 12S according to Embodiment 1 are formed.

Next, various semiconductor elements are formed in an active region encompassed with the element isolation portions. Here, manufacturing steps of a CMIS (complementary metal insulator oxide semiconductor) device are described briefly as one example of these elements. In the description described below, MISFET (metal insulator semiconductor field effect transistor) representative of field effect transistors is abbreviated as MIS. A p channel MISFET is abbreviated as pMIS and an n channel MISFET is abbreviated as nMIS.

Figure 11:
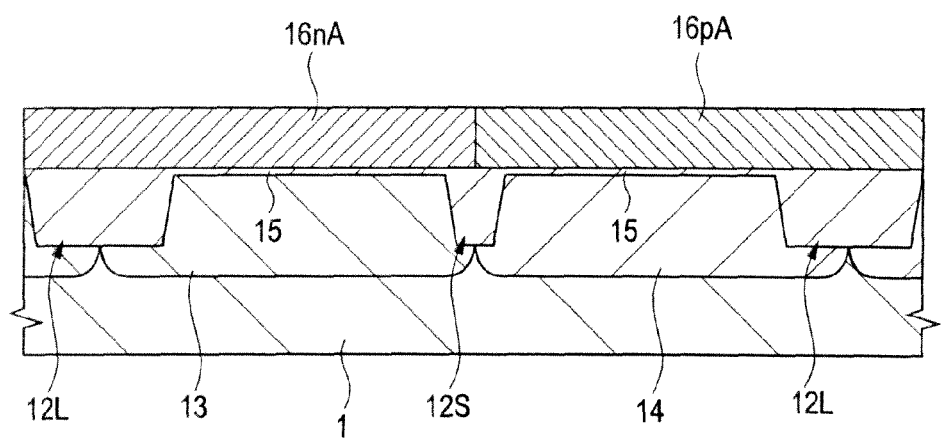
FIG. 11 is a fragmentary cross-sectional view of the same portion as that of FIG. 1 during a manufacturing step of the element isolation portion following the step shown in FIG. 10.

First, as illustrated in FIG. 11, a p well 13 is formed by ion-implanting a p conductivity type impurity into the semiconductor substrate 1 in a region (nMIS formation region) where an nMIS is to be formed, while an n well 14 is formed by ion-implanting an n conductivity type impurity into the semiconductor substrate 1 in a region (pMIS formation region) in which a pMIS is to be formed.

Next, after washing the main surface of the semiconductor substrate 1, a gate insulating film 15 is formed on the main surface of the semiconductor substrate 1 (respective surfaces of the p well 13 and the n well 14). During the washing, the silicon oxide film 2 formed on the main surface of the semiconductor substrate 1 is removed. Then, a conductor film (for example, a polycrystalline silicon film having an n conductivity type impurity introduced therein) 16nA configuring a gate electrode of the nMIS is formed on the gate insulating film 15 in the nMIS formation region. Similarly, a conductor film (for example, a polycrystalline silicon film having a p conductivity type impurity introduced therein) 16pA configuring a gate electrode of the pMIS is formed on the gate insulating film 15 in the pMIS formation region.

Figure 12:
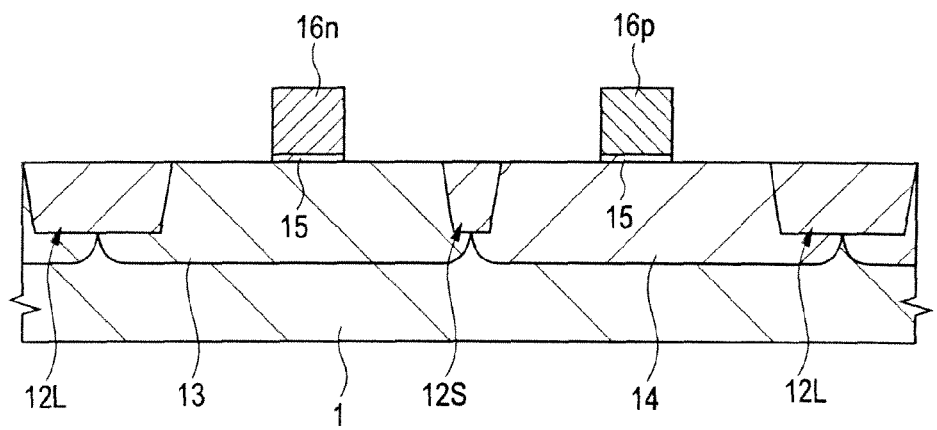
FIG. 12 is a fragmentary cross-sectional view of a semiconductor device during a manufacturing step for describing a manufacturing method of a semiconductor device according to Embodiment 1 of the invention.

Next, as illustrated in FIG. 12, the conductor film 16nA is processed using lithography and dry etching to form a gate electrode 16n of the nMIS on the gate insulating film 15 in the nMIS formation region. Similarly, the conductor film 16pA is processed to form a gate electrode 16p of the pMIS on the gate insulating film 15 in the pMIS formation region.

As described above, the trench 4S has no void 7 in the upper portion thereof and it is filled sufficiently with the first buried oxide film 8 and the protecting film 11. The trench 4L has, in the upper portion thereof, no recess which will otherwise occur due to insufficient burying of the first buried oxide film 8 and is filled sufficiently with the first buried oxide film 8 and the second buried oxide film 9. Further, there appears no step difference at a boundary (interface) between the element isolation portion 12L or 12S and the active region. Since the element isolation regions 12L and 12S do not have any etching residue due to the void 7, recess, or step difference, problems such as processing failure of the gate electrodes 16n and 16p can be avoided.

Figure 13:
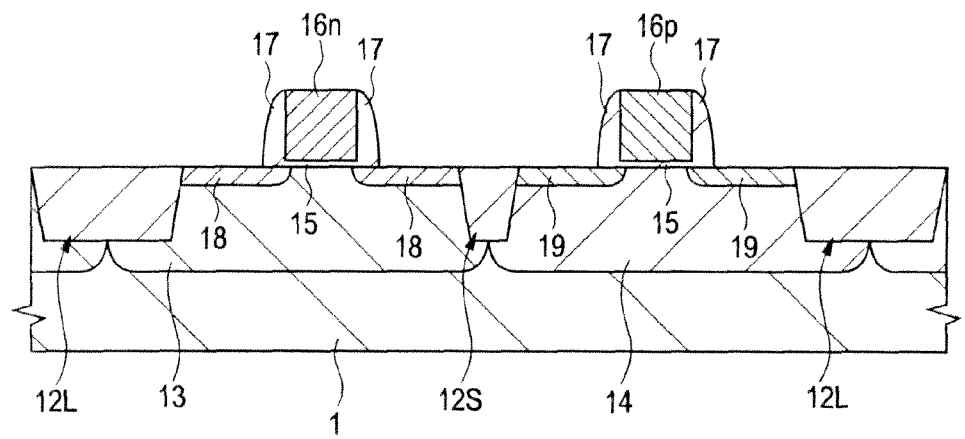
FIG. 13 is a fragmentary cross-sectional view of the same portion as that of FIG. 12 during a manufacturing step of the semiconductor device following the step shown in FIG. 12.

Next, as illustrated in FIG. 13, a sidewall 17 is formed on the side walls of each of the gate electrode 16n of the nMIS and the gate electrode 16p of the pMIS. Then, an n conductivity type impurity is ion-implanted into the p well 13 on both sides of the gate electrode 16n of the nMIS to form n type semiconductor regions 18 functioning as the source/drain of the nMIS are formed in self alignment with the gate electrode 16n and the sidewalls 17. Similarly, a p conductivity type impurity is ion-implanted into the n well 14 on both sides of the gate electrode 16p of the pMIS to form p type semiconductor regions 19 functioning as the source/drain of the pMIS are formed in self alignment with the gate electrode 16p and the sidewalls 17.

Figure 14:
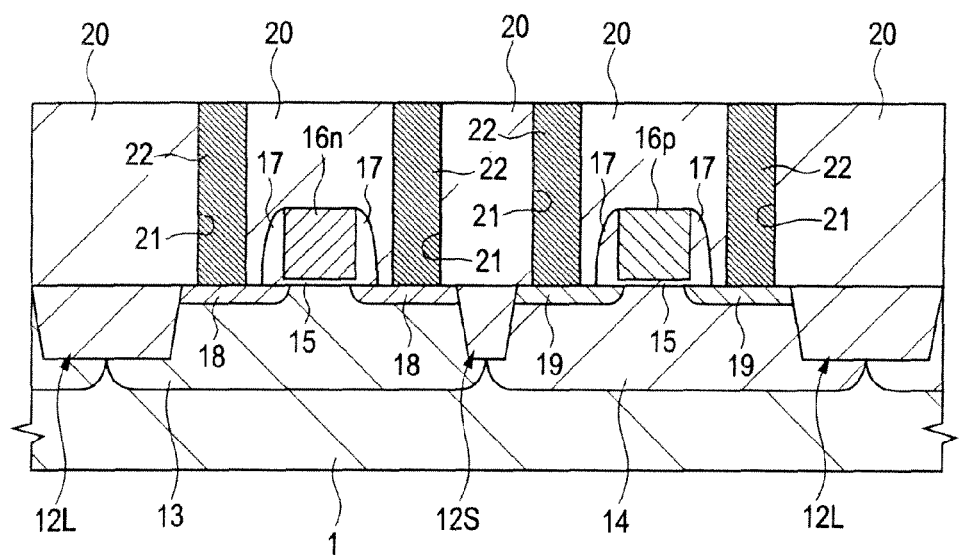
FIG. 14 is a fragmentary cross-sectional view of the same portion as that of FIG. 12 during a manufacturing step of the semiconductor device following the step shown in FIG. 13.

Next, as illustrated in FIG. 14, an insulating film 20 is formed on the main surface of the semiconductor substrate 1. Then, by using lithography and dry etching, the insulating film 20 is processed to form a connecting hole 21. This connecting hole 21 is formed in necessary portions on the n type semiconductor region 18 or p type semiconductor region 19. Then, a plug 22 having, for example, a tungsten (W) film as a main conductor is formed in the connecting hole 21.

Figure 15:
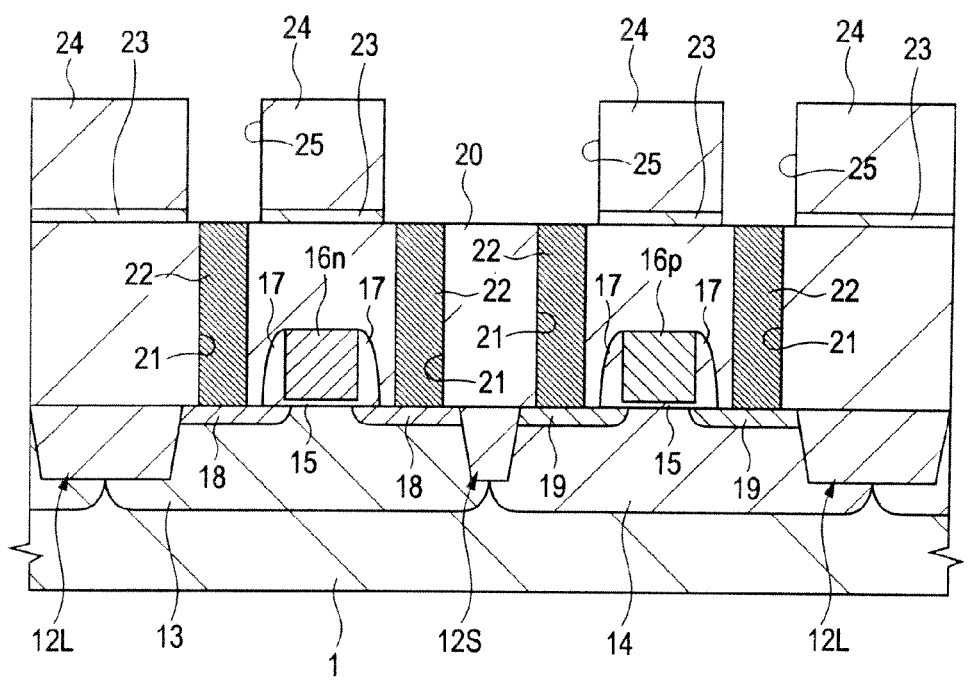
FIG. 15 is a fragmentary cross-sectional view of the same portion as that of FIG. 12 during a manufacturing step of the semiconductor device following the step shown in FIG. 14.

Next, as illustrated in FIG. 15, a stopper insulating film 23 and an insulating film 24 for forming wirings are formed successively on the main surface of the semiconductor substrate 1. The stopper insulating film 23 is a film serving as an etching stopper upon trench processing in the insulating film 24 and a material having an etch selectivity with respect to the insulating film 24 is used for it. The stopper insulating film 23 is, for example, a silicon nitride film formed by plasma CVD and the insulating film 24 is, for example, a silicon oxide film formed by plasma CVD.

Next, a wiring trench 25 in a recessed form is formed in predetermined regions of the stopper insulating film 23 and the insulating film 24 by using lithography and dry etching.

Figure 16:
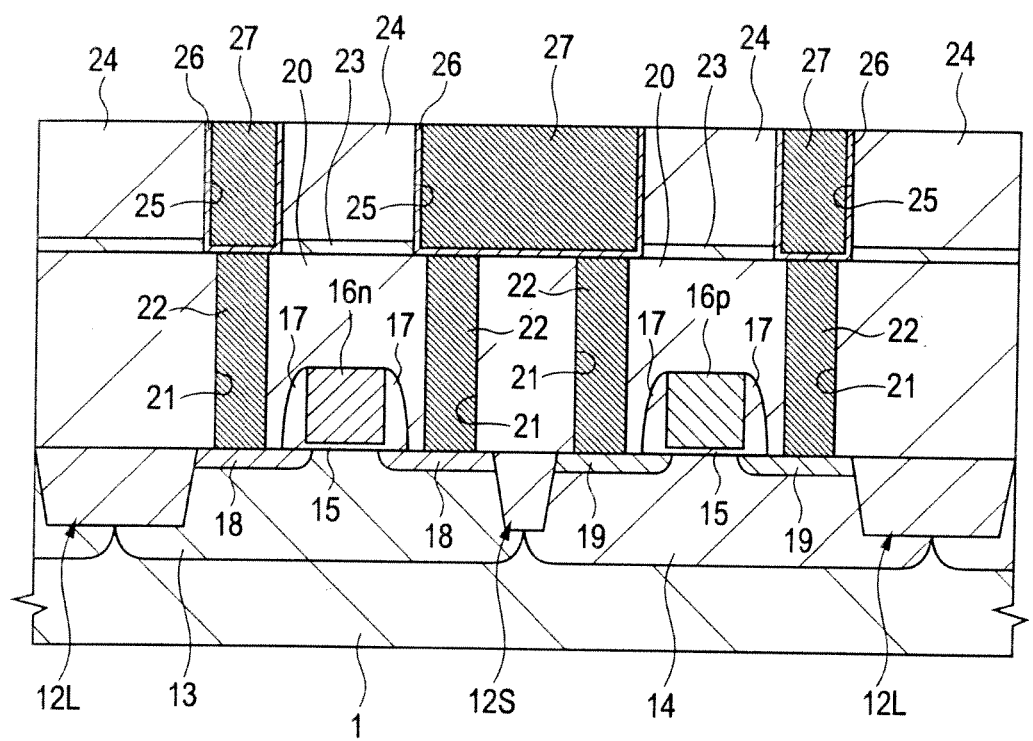
FIG. 16 is a fragmentary cross-sectional view of the same portion as that of FIG. 12 during a manufacturing step of the semiconductor device following the step shown in FIG. 15.

Next, as illustrated in FIG. 16, a barrier metal film 26 is formed on the main surface of the semiconductor substrate 1. The barrier metal 26 is, for example, a titanium nitride (TiN)

film, a tantalum (Ta) film, a tantalum nitride (TaN) film, or the like. Then, a copper (Cu) seed layer (not illustrated) is formed on the barrier metal film 26 by using CVD or sputtering, followed by formation of a copper plating film 27 on the seed layer by electroplating. The copper plating film 27 is filled in the wiring trench 25.

Next, the copper plating film 27, the seed layer, and the barrier metal film 26 in a region other than the inside of the wiring trench 25 are removed using CMP to form a first-level wiring having the copper film as a main conductor. In the present embodiment, the copper film which is a main conductor configuring the first-level wiring is formed using electroplating, but it may be formed using CVD, sputtering, or sputtering reflow.

Although not illustrated, after formation of upper wiring layers, a passivation film is formed on the uppermost layer wiring for preventing invasion of water or impurities from the outside or suppressing transmission of a rays. Next, after exposure of a portion (bonding pad portion) of the uppermost layer wiring by the processing of the passivation film, a bump underlying electrode coupled to the exposed uppermost layer wiring is formed. Then, a bump electrode coupled to the bump underlying electrode is formed. As a result, a semiconductor device according to the present embodiment is substantially completed. This bump electrode serves as an electrode for external coupling. After that, the wafer is diced into individual semiconductor chips and they are mounted on a package substrate or the like, but a description on it is omitted.

As described above, according to Embodiment 1, a polysilazane film 6 is formed in such a manner that the upper surface level of the polysilazane film 6 to be filled in a trench 4S having a trench width of 0.2 μm or less becomes higher than the upper surface level of a pad insulating film 3 and the upper surface level of the polysilazane film 6 to be filled in a trench 4L having a trench width of 1.0 μm or more becomes lower than the upper surface level of the pad insulating film 3, followed by heat treatment at 300° C. or more. This makes it possible to simultaneously achieve conversion of the polysilazane film 6 into a first buried oxide film 8 made of silicon oxide ($SiO_2$) and removal of a void 7 formed in the upper portion (near the main surface of a semiconductor substrate 1) of the trench 4S. In addition, by forming a second buried oxide film 9 on the upper surface of the first buried oxide film 8, insufficient burying of the trench 4L can be overcome. As a result, an element isolation portion 12S comprised of a narrow isolation trench permitting good burying and an element isolation portion 12L comprised of a wide isolation trench can be formed.

Embodiment 2

A method of manufacturing a semiconductor device employing a trench type element isolation portion according to Embodiment 2 will hereinafter be described in the order of steps while referring to FIGS. 17 to 20. FIGS. 17 to 20 are fragmentary cross-sectional views for describing manufacturing steps of the element isolation portion.

First, similar to Embodiment 1 described above, for example, a trench (narrow isolation trench) 4S having a trench width of 0.2 μm or less and a trench (wide isolation trench) 4L having a trench width of 1.0 μm or more are formed. An inner-wall oxide film 5 is then formed on the inner walls (side surface and bottom surface) of each of the trenches 4L and 4S.

Figure 17:
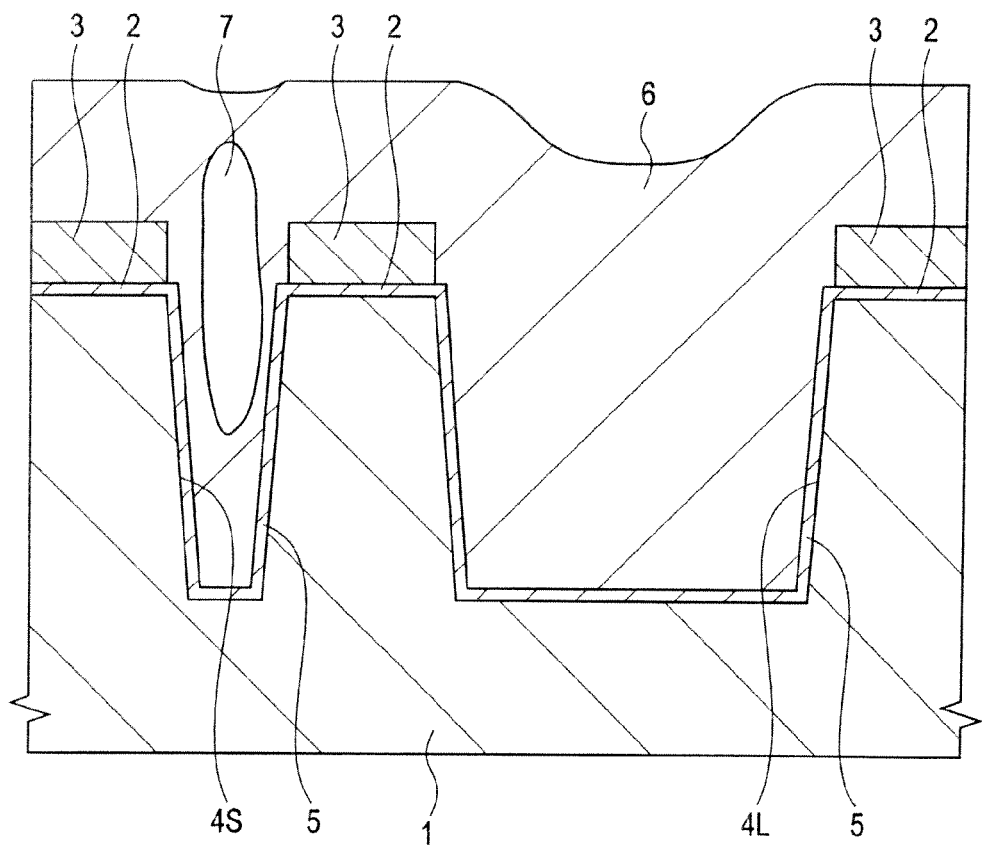
FIG. 17 is a fragmentary cross-sectional view of an element isolation portion during a manufacturing step for describing a manufacturing method of an element isolation portion according to Embodiment 2 of the invention.

Next, as illustrated in FIG. 17, for example, a polysilazane solution obtained by dissolving polysilazane (—($SiH_2$—NH)$_n$—) in an organic solvent such as dibutyl ether is applied onto the main surface of the semiconductor substrate 1 including the inside of the trenches 4L and 4S by using the method of application (spin coating) to form a polysilazane film 6. The number of rotations in the method of application is, for example, 1000 rpm.

When the polysilazane film 6 is formed on the main surface of the semiconductor substrate 1, a plurality of voids 7 is sometimes formed partially in the trench 4S which is a narrow isolation trench. In Embodiment 1 described above, the polysilazane film 6 is formed in such a manner that the void 7 in the upper portion (near the main surface of the semiconductor substrate 1) of the trench 4S is not completely buried in the polysilazane film 6 and it is opened at the upper portion thereof. In Embodiment 2, on the other hand, the polysilazane film 6 is formed in such a manner that the void 7 in the upper portion (near the main surface of the semiconductor substrate 1) of the trench 4S is completely buried in the polysilazane film 6 and the void 7 is not opened at the upper portion thereof.

Then, a baking treatment is performed at about 150° C. in the atmosphere to evaporate the organic solvent, which is followed by a heat treatment at 300° C. or more in a water vapor atmosphere, for example, a heat treatment at from 300° C. to 800° C. in a water vapor atmosphere or a heat treatment at about 1000° C. in an inert gas atmosphere. By this treatment, the polysilazane film 6 is densified into a first buried oxide film 8 having a stoichiometric composition ($SiO_2$).

Figure 18:
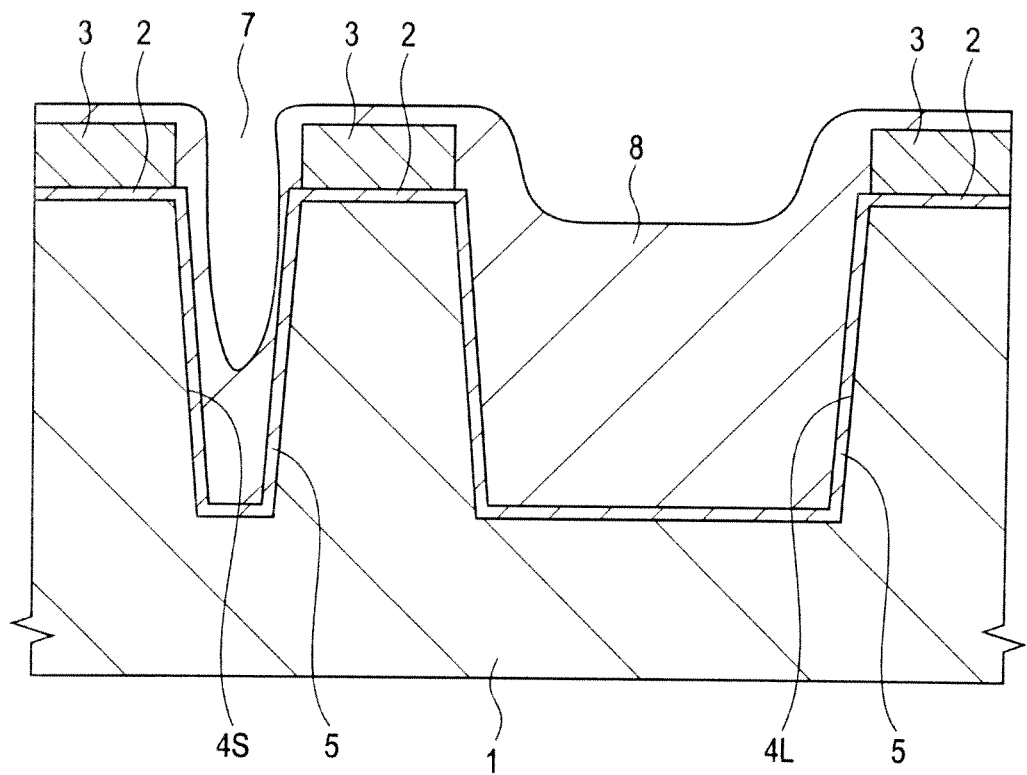
FIG. 18 is a fragmentary cross-sectional view of the same portion as that of FIG. 17 during a manufacturing step of the element isolation portion following the step shown in FIG. 17.

Next, as illustrated in FIG. 18, the first buried oxide film 8 is etched back to the vicinity of the upper surface of the pad insulating film 3 (or until the upper surface of the pad insulating film 3 is exposed) with a solution containing hydrogen fluoride or the like to open the upper portion of the void 7 in the upper portion (near the main surface of the semiconductor substrate 1) of the trench 4S and widen the void 7. Incidentally, it is more preferred to etch back the first buried oxide film 8 until in the trench 4L with no void 7 formed therein, the upper surface level of the first buried oxide film 8 becomes lower than the upper surface level of the pad insulating film 3, because it ensures opening of the upper portion of the void 7.

Figure 19:
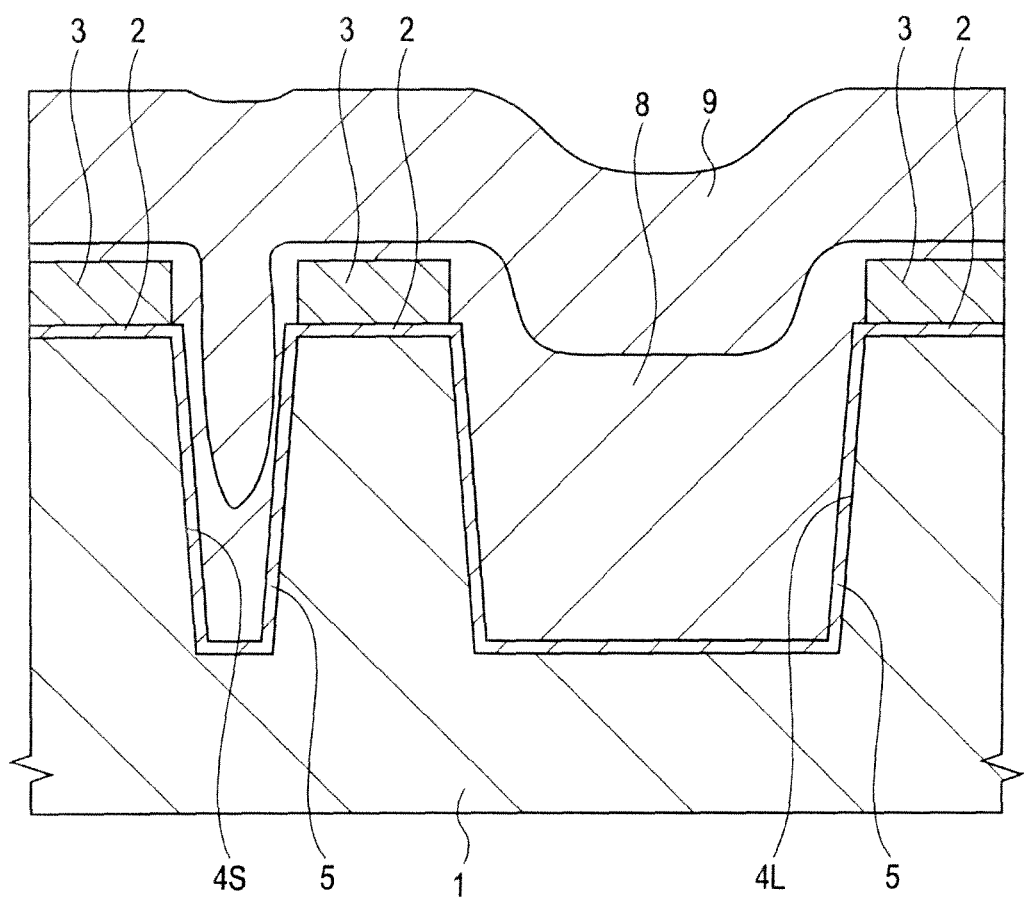
FIG. 19 is a fragmentary cross-sectional view of the same portion as that of FIG. 17 during a manufacturing step of the element isolation portion following the step shown in FIG. 18.

Then, as illustrated in FIG. 19, a second buried oxide film 9 is formed on the upper surface of the first buried oxide film 8 to fill the opened void 7 and the unburied portion (recess) of the trench 4L, which is a wide isolation trench, with the second buried oxide film 9. For example, the second buried oxide film 9 is formed in such a manner that the upper surface level of the second buried oxide film 9 to be filled in the trench 4L becomes higher than the upper surface level of the pad insulating film 3. The second buried oxide film 9 can be formed using, for example, the method of application, SA-CVD, or HDP-CVD, but film formation using the method of application is desired from the standpoint of burying the film in the void 7 or the like.

When the second buried oxide film 9 is formed using the method of application, it is formed in a similar manner to that employed for the formation of the first buried oxide film 8. Described specifically, a polysilazane solution obtained by dissolving polysilazane (—($SiH_2$—NH)$_n$—) in an organic solvent such as dibutyl ether is applied onto the main surface of the semiconductor substrate 1 by using the method of application (spin coating) to form a polysilazane film. Then, a baking treatment is performed at about 150° C. in the atmosphere, followed by the heat treatment at 300° C. or more in a water vapor atmosphere or the like. By these treatments, the polysilazane film is densified into a second buried oxide film 9 having a stoichiometric composition ($SiO_2$).

Next, as in Embodiment 1, the surface of the second buried oxide film 9 and further, the surface of the first buried oxide film 8 are polished using CMP with the pad insulating film 3 as a stopper film. The upper surface level of each of the element isolation films 10L and 10S is then controlled with a solution containing hydrogen fluoride or the like. If necessary, a protecting film 11 is formed as in Embodiment 1.

Figure 20:
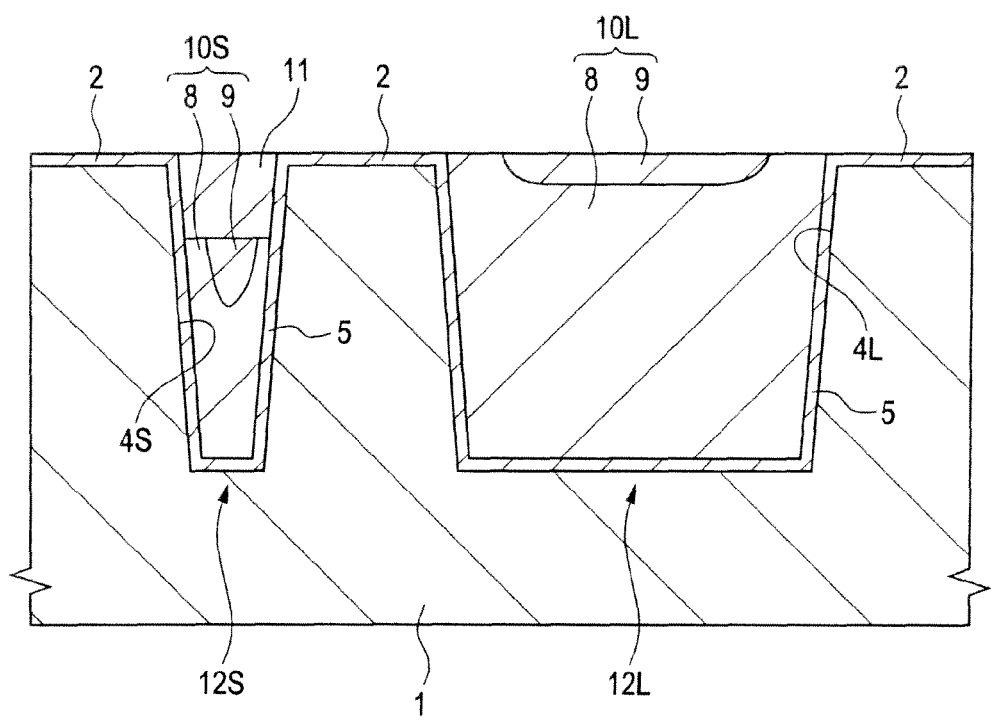
FIG. 20 is a fragmentary cross-sectional view of the same portion as that of FIG. 17 during a manufacturing step of the element isolation portion following the step shown in FIG. 19.

Next, as illustrated in FIG. 20, the pad insulating film 3 is removed using hot phosphoric acid. By the manufacturing steps described above, the element isolation portions 12L and 12S according to Embodiment 2 are formed.

As in Embodiment 1 described above, the polysilazane film 6 may be formed in such a manner that the upper surface level of the polysilazane film 6 buried in the trench 4S having a trench width of 0.2 μm or less becomes higher than the upper surface level of the pad insulating film 3 and at the same time the upper surface level of the polysilazane film 6 buried in the trench 4L having a trench width of 1.0 μm or more becomes lower than the upper surface level of the pad insulating film 3. In this case, the void 7 generated in the upper portion (near the main surface of the semiconductor substrate 1) of the trench 4S has an opening. The etching-back widens the void 7 and thereby facilitates burying in the void 7 which is performed later.

Thus, according to the present embodiment 2, by etching back the polysilazane film 6 formed by the method of application, thereby opening the void 7 formed in the upper portion (near the main surface of the semiconductor substrate 1) of the trench 4S having a trench width of 0.2 μm or less and then carrying out a heat treatment at 300° C. or more, the polysilazane film 6 can be converted into a first buried oxide film 8 made of silicon oxide ($SiO_2$) and at the same time, the void 7 can be removed. Further, after removal of the void, a second buried oxide film 9 is formed on the upper surface of the first buried oxide film 8 so that insufficient burying of the trench 4L can be overcome. As a result, it is possible to form an element isolation portion 12S comprised of a narrow isolation trench which permits good burying and the element isolation portion 12L comprised of a wide isolation trench.

Inventions made by the present inventors have been described specifically based on some embodiments. It is needless to say that the invention is not limited to or by these embodiments but can be changed in various ways without departing from the gist of the invention.

The invention can be applied to trench type element isolation portions that electrically isolate a plurality of active regions in which a semiconductor element is formed.

What is claimed is:

1. A method of manufacturing a semiconductor device, comprising:

forming a pad insulating film over the main surface of a semiconductor substrate;

successively processing the pad insulating film and the semiconductor substrate in a predetermined region to form a plurality of trenches including a first trench having a width of 0.2 μm or less and a second trench having a width of 1.0 μm or more;

thermally oxidizing the side surface and the bottom surface of each of the trenches;

applying a solution containing polysilazane onto the main surface of the semiconductor substrate including the inside of the trenches by using the method of application to form a first polysilazane film as a first insulating film to be buried in the trenches;

applying a solution containing polysilazane to the upper surface of the first polysilazane film by using the method of application to form a second polysilazane film;

carrying out a heat treatment at from 300° C. to 800° C. in a water vapor atmosphere to convert the first polysilazane film into a silicon oxide film, thereby forming a first buried oxide film and at the same time, convert the second polysilazane film into a silicon oxide film, thereby forming a second buried oxide film;

polishing the surface of each of the first buried oxide film and the second buried oxide film to planarize the same; and after the polishing of the surface, removing the pad insulating film, wherein in the applying of the solution containing polysilazane onto the main surface, the first trench is completely filled with the first polysilazane film and the second trench is not completely filled with the first polysilazane film.

2. The method of manufacturing a semiconductor device according to claim 1, wherein in the applying of the solution containing polysilazane onto the main surface, the upper surface level of the first polysilazane film buried in the first trench is higher than the upper surface level of the pad insulating film and at the same time, the upper surface level of the first polysilazane film buried in the second trench is lower than the upper surface level of the pad insulating film.

3. The method of manufacturing a semiconductor device according to claim 1, wherein in the applying of the solution containing polysilazane onto the main surface, a third trench having a width greater than 0.2 μm but smaller than 1.0 μm is filled completely with the first polysilazane film.

4. The method of manufacturing a semiconductor device according to claim 1, wherein the pad insulating film has a silicon nitride film and a silicon oxide film is formed between the main surface of the semiconductor substrate and the pad insulating film.

5. The method of manufacturing a semiconductor device according to claim 2, wherein the upper surface level of the first polysilazane film to be buried in the second trench is lower than the main surface of the semiconductor substrate.

* * * * *